// United States Patent [15] 3,678,573
Driver [45] July 25, 1972

[54] SELF-ALIGNED GATE FIELD EFFECT TRANSISTOR AND METHOD OF PREPARING

[72] Inventor: Michael C. Driver, Trafford, Pa.

[73] Assignee: Westinghouse Electric Corporation, Pittsburgh, Pa.

[22] Filed: March 10, 1970

[21] Appl. No.: 18,226

[52] U.S. Cl. ....... 29/571, 29/578
[51] Int. Cl. ....... B01j 17/00, H01g 13/00
[58] Field of Search ....... 29/571, 578; 117/212; 156/8; 317/235 A

[56] References Cited

UNITED STATES PATENTS

| | | | |
|---|---|---|---|
| 3,193,418 | 7/1965 | Cooper et al. | 148/187 |
| 3,520,741 | 7/1970 | Mankarious | 29/578 X |
| 3,551,220 | 12/1970 | Meer et al. | 148/175 |
| 3,576,683 | 4/1971 | Matsubara | 117/212 X |

*Primary Examiner*—John F. Campbell
*Assistant Examiner*—W. Tupman
*Attorney*—F. Shapoe and C. L. Menzemer

[57] ABSTRACT

This disclosure relates to a high frequency field effect transistor with and accurately aligned gate contact disposed between source and drain contacts. The device consists of a substrate having a substantially flat upper surface, a layer of lightly doped semiconductor material having its bottom surface disposed on the surface of the substrate and a metal layer disposed on the upper surface of the layer of semiconductor material. An aperture is formed through the metal layer into the layer of semiconductor material. The gate contact is disposed within the aperture while the metal layer around the periphery of the aperture form the source and drain contacts.

3 Claims, 5 Drawing Figures

INVENTOR
Michael C. Driver
BY
C. L. Menzemer
ATTORNEY

SELF-ALIGNED GATE FIELD EFFECT TRANSISTOR AND METHOD OF PREPARING

BACKGROUND OF THE INVENTION

1. Field of the Invention

This invention is in the field of semiconductor devices generally and more particularly in the field of field effect transistors.

2. Prior Art

Prior art devices are usually made employing diffusion through two or more photoresist masks. The positioning and alignment of the masks makes it difficult to have the gate contact positioned precisely equal distant between the source and drain contacts. In addition, the prior art techniques make it difficult to produce a device in which the source and drain can be positioned close enough to provide a high frequency responsive device.

SUMMARY OF THE INVENTION

In accordance with the present invention there is provided a process for preparing a semiconductor device comprising:

1. growing a lightly doped n-type epitaxial layer of a semiconductor material on a surface of a p-type substrate of the same type of semiconductor material,
2. depositing a metal layer to one surface of the epitaxial layer, said one surface being parallel to the surface of the epitaxial layer in contact with the substrate,
3. disposing a layer of photoresist on the metal layer,
4. developing a pattern in the photoresist,
5. etching an aperture through the metal layer,
6. etching an aperture in the epitaxial layer below the metal layer, said metal layer being used as a mask for said etching, and
7. affixing a metal contact to the epitaxial layer within the aperture.

BRIEF DESCRIPTION OF THE DRAWING

The invention will become more readily apparent from the following exemplary description in connection with the accompanying drawings, wherein.

DESCRIPTION OF PREFERRED EMBODIMENT

The present invention will be described in terms of a silicon field effect transistor. It should be understood however, that the device can be made employing any known semiconductor material such for example germanium, Group III-Group V compounds, Group II-Group VI compounds and silicon carbide.

Figure 1:
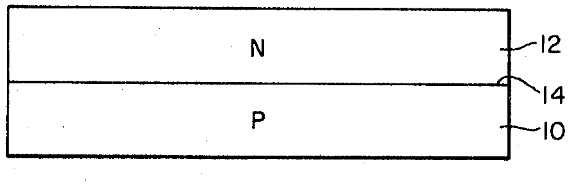
FIGS. 1 & 2 are side views of a body of semiconductor material undergoing processing in accordance with the teachings of this invention.

With reference to FIG. 1, there is shown a substrate 10 upon which has been grown an epitaxial layer 12 of silicon.

The substrate 10 consists of p-type silicon doped to a concentration of from about $10^{14}$ to $10^{16}$ atoms of dopant per cubic centimeter of silicon.

The epitaxial layer 12 of silicon is n-type silicon having a thickness usually of about 4 to 5 microns and lightly doped to only a concentration of about $10^{14}$ to $10^{16}$ atoms of dopant per cubic centimeter of silicon.

The doping concentration and thickness of the epitaxial layer determine the gate pinch-off voltage. The thinner the epitaxial layer and the lower the doping concentration, the lower the pinch-off voltage. A layer two microns thick doped to a concentration of $10^{15}$ atoms of dopant per cubic centimeter of silicon has a gate pinch-off voltage of only 3.2 volts.

The substrate 10 must be p-type silicon or the channel between source and drain contacts cannot be pinched off at any gate pinch-off voltage.

Further, the crystalline structure match at interface 14 between the substrate 10 and epitaxial layer 12 must be matched as closely matched as possible. Any mismatch in crystal lattice structure at interface 14 reduces carrier mobility in the channel between the source and drain. Reduction in carrier mobility reduces the frequency at which the device will operate.

Figure 2:
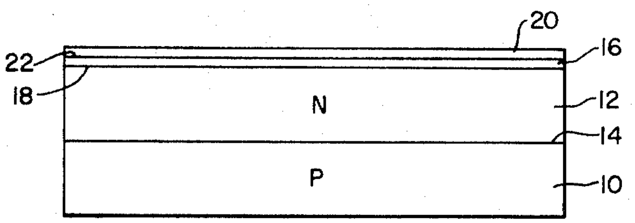

With reference to FIG. 2, following the growth of the epitaxial layer 12 on the substrate 10, a metal layer 16 is deposited on top surface 18 of the epitaxial layer 12.

The layer 16 may consist of any metal which is relatively resistant to silicon etchants as for example; gold, chromium, lead, molybdenum, tungsten and tantalum. Gold is preferred.

The thickness of layer 16 may vary from a minimum of about 300 to 2,000 A or more. A thickness of about 500 A is preferred.

A layer 20 of a suitable photoresist material is then disposed on surface 22 of metal layer 16. A preselected pattern of a field effect transistor is exposed on the photoresist and developed. Subsequently, using an etchant capable of etching through the metal layer 16, such as an etchant comprised of 1 part nitric acid, 3 parts hydrochloric acid and 4 parts water, all parts by volume, predetermined portions of the metal layer 16 is etched away. The resultant structure is shown in FIG. 3.

The mask outline shown for photoresist exposure and etching actually comprises two transistors, one inside the other.

Figure 3:
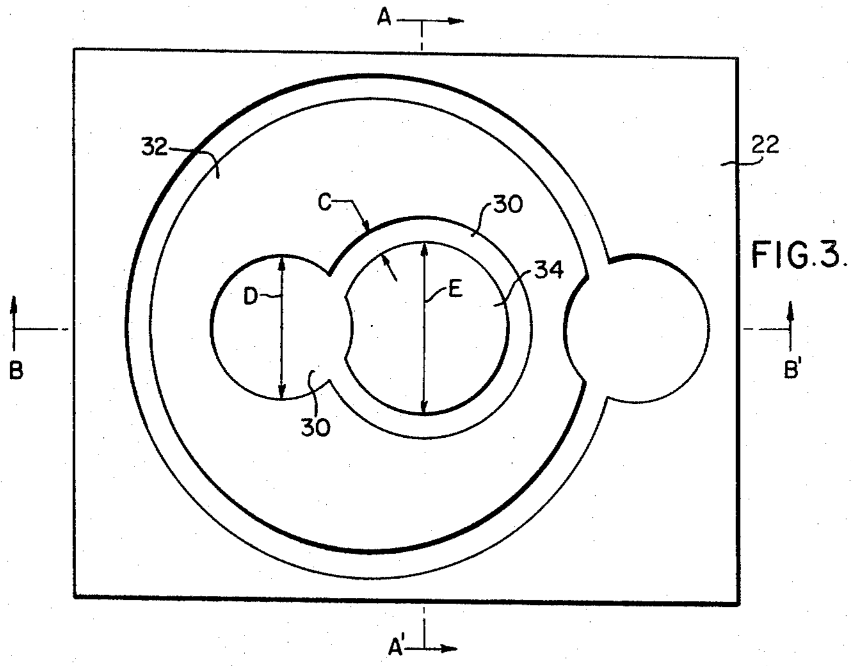
FIG. 3 is a top view of the body of FIGS. 1 and 2 undergoing further treatment in accordance with the teachings of this invention.

The area in FIG. 3 designated 30 is etched through the metal layer 16. The area 30 is gate contact area. The areas denoted as 32 and 34 of metal layer 16 are source and drain contacts. They are interchangeable, however, for purposes of explanation metal area 32 will be denoted as drain contact and metal area 34 will be denoted as source contact.

Next, employing a suitable etchant such for example one consisting 25 parts nitric acid, 10 parts acetic acid and 0.25 parts hydrofluoric acid, the area denoted as 30 in FIG. 3 is etched into the epitaxial layer 12 to a depth of about one-half the thickness of the layer 12. The metal layer 16 acts as a mask for the etching of the silicon layer 12. The etching is carried out in such a manner that metal layer 16 over hangs the etched cavity in layer 12.

Figure 4:
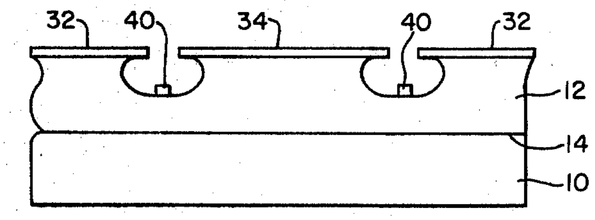
FIG. 4 is a sectional view of the body of FIG. 3 taken along line A–A'.
Figure 5:
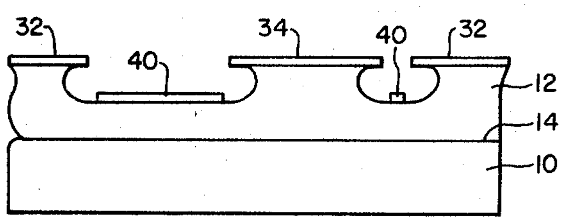
FIG. 5 is a sectional view of the body of FIG. 3 taken along the line B–B'.

The resultant structure is shown in FIGS. 4 and 5. FIG. 4 is a cross-sectional view taken along line A–A' and FIG. 5 is a cross-sectional view taken along line B–B'.

In a typical device the diameter D, FIG. 3, is 200 microns and the diameter E, FIG. 3, 4 mils.

Following the etching of the aperture into the layer 12, a gate contact 40, FIGS. 4 and 5 are vapor deposited in the cavity. The gate contact consists of an electrically conductive metal such for example as aluminum, copper, tin, silver, gold and platinum. The gate contact 40 may have a thickness of from 300 to 1,000 A and preferably a thickness of about 500 A.

The field effect transistor of this invention can readily be made with a small source-drain contact spacing. Devices have been prepared with a source-drain spacing of one micron which provides a device with an operational frequency of 10GHz.

The method of preparation of this invention does not require accurate diffusion controls as do prior art techniques. In addition, all the contacts of the device of this invention are self-aligned and the spacing between contacts is limited only by the width of the pattern which can be drawn in the photoresist.

I claim as my invention:

1. A process for preparing a semi-conductor device comprising:

1. growing a lightly doped n-type epitaxial layer of a semiconductor material on a surface of a p-type substrate of the same type of semiconductor material, 2. depositing a metal layer to one surface of the epitaxial layer, said one surface being parallel to the surface of the epitaxial layer in contact with the substrate,
3. disposing a layer of photoresist on the metal layer,
4. developing a pattern in the photoresist,
5. etching away a portion of the metal layer to form source and drain contacts,
6. etching an aperture through a remaining portion of the metal layer,
7. etching an aperture in the epitaxial layer below the metal layer, said remaining portion of the metal layer being used as a mask for said etching, and
8. affixing a metal contact to the epitaxial layer within the aperture.

2. The process of claim 1 in which the epitaxial layer is grown to a thickness of from 4 to 5 microns and is doped to a concentration of from $10^{14}$ to $10^{16}$ atoms of dopant per cubic centimeter of semiconductor material.

3. The process of claim 2 in which the substrate is p-type silicon, the epitaxial layer is n-type silicon, and the metal layer consists of gold.

* * * * *